(12) United States Patent
Augur et al.

(10) Patent No.: US 11,837,547 B2
(45) Date of Patent: Dec. 5, 2023

(54) PIC DIE WITH OPTICAL DEFLECTOR FOR AMBIENT LIGHT

(71) Applicant: GlobalFoundries U.S. Inc., Malta, NY (US)

(72) Inventors: Roderick Alan Augur, Saratoga Springs, NY (US); Yusheng Bian, Ballston Lake, NY (US); Robert John Fox, III, Greenfield Center, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 265 days.

(21) Appl. No.: 17/450,324

(22) Filed: Oct. 8, 2021

(65) Prior Publication Data

US 2023/0113261 A1 Apr. 13, 2023

(51) Int. Cl.
  *H01L 23/532* (2006.01)
  *H01L 23/552* (2006.01)
  *H01L 23/522* (2006.01)

(52) U.S. Cl.
  CPC .... *H01L 23/53295* (2013.01); *H01L 23/5226* (2013.01); *H01L 23/552* (2013.01)

(58) Field of Classification Search
  CPC ........... H01L 23/53295; H01L 23/5226; H01L 23/552
  USPC ....................................................... 257/734
  See application file for complete search history.

(56) References Cited

U.S. PATENT DOCUMENTS 11,137,560 B2 * 10/2021 Iida .................. H01L 25/167

OTHER PUBLICATIONS

Bertilsson, "Design of Multilayer Dielectric Mirrors Optimized for Femtosecond Laser Pulses," Bachelor's thesis, Lund University, May 2015 (32 pages).
Bian et al., "Monolithically integrated silicon nitride platform," Th1A.46, OFC 2021, OSA 2021 (3 pages).
Bian et al., "Towards low-loss monolithic silicon and nitride photonic building blocks in state-of-the-art 300mm CMOS foundry," FW5D. 2.pdf, Frontiers in Optics/Laser Science, OSA 2020 (2 pages).
Dai et al., "Design and fabrication of UV band-pass filters based on SiO2/Si3N4 dielectric distributed bragg reflectors," Applied Surface Science, 364:886-91, 2016 (6 pages).
Giewont et al., "300-mm Monolithic Silicon Photonics Foundry Technology," IEEE Journal of Selected Topics in Quantum Electronics, 25:8200611, Sep./Oct. 2019 (12 pages).

(Continued)

*Primary Examiner* — Tu-Tu V Ho
(74) *Attorney, Agent, or Firm* — Anthony Canale; Hoffman Warnick LLC (57) ABSTRACT

A photonic integrated circuit (PIC) die includes a silicon nitride optical component over an active region. Multiple interconnect layers are over the silicon nitride optical component, each of the multiple interconnect layers including a metal interconnect therein. At least one optical deflector is over the multiple interconnect layers and over the silicon nitride optical component. The optical deflector(s) may also include a contact passing therethrough to the interconnect layers, but do not include any other electrical interconnects. Each optical deflector may deflect light within an ambient light range of less than 570 nanometers (nm) to protect the silicon nitride optical component from light-induced degradation.

20 Claims, 8 Drawing Sheets

(56) References Cited

OTHER PUBLICATIONS

Neutens et al., "Mitigation of UV-Induced Propagation Loss in PECVD Silicon Nitride Photonic Waveguides," ACS Photonics, 5:2145-50, 2018 (6 pages).
Rakowski et al., "45nm CMOS—Silicon Photonics Monolithic Technology (45CLO) for next-generation, low power and high speed optical interconnects," T3H.3.pdf, OFC 2020, OSA 2020 (3 pages).
Wilmart et al., "A Versatile Silicon-Silicon Nitride Photonics Platform for Enhanced Functionalities and Applications," Applied Sciences, 9:255, 2019 (16 pages).

\* cited by examiner

PIC DIE WITH OPTICAL DEFLECTOR FOR AMBIENT LIGHT

BACKGROUND

The present disclosure relates to photonic integrated circuits (PIC) dies, and more specifically, to a PIC die including an optical deflector for ambient light.

Photonic integrated circuit (PIC) dies include electrically active regions operatively coupled to light- or optics-based communications components, such as waveguides and photodetectors. Silicon nitride (SiN) is a common material for forming optic components in PIC dies because it can handle high frequency light signals (e.g., 1260-1550 nanometer wavelengths) with low propagation losses. One challenge with manufacturing PIC dies with SiN optics components is that SiN can degrade when exposed to ambient light (e.g., wavelengths between 380-780 nm). This situation is referred to as light-induced degradation (LID). Ambient light can even cause LID to SiN optical components deep within PIC dies and under many electrical interconnect layers that include dielectric material and a variety of metal interconnects. LID can occur at a variety of timeframes such as after PIC die manufacture, during packaging and during use. Enclosing the PIC die in an ambient light-impervious container is not always practicable, e.g., enclosing the die is not possible during packaging. One approach to address this challenge is to block the ambient light or direct it away from the SiN components. Thin-film dielectric stacks have been used for band-pass filters or anti-reflection devices for laser mirrors (Bragg reflectors).

SUMMARY

An aspect of the disclosure is directed to a photonic integrated circuit (PIC) die, comprising: an active region over a substrate; a silicon nitride optical component over the active region; multiple interconnect layers over the active region, each of the multiple interconnect layers including a metal interconnect therein; and at least one optical deflector over the multiple interconnect layers and over the silicon nitride optical component.

Another aspect of the disclosure includes a photonic integrated circuit (PIC) die, comprising: an active region over a substrate; a silicon nitride waveguide over the active region; multiple interconnect layers over the active region, each of the multiple interconnect layers including a metal interconnect therein; and at least one optical deflector over the multiple interconnect layers, each optical deflector including a plurality of alternating layers including at least one high refractive index dielectric layer and at least one low refractive index dielectric layer.

An aspect of the disclosure related to a photonic integrated circuit (PIC) die, comprising: an active region over a substrate; a silicon nitride optical component over the active region; multiple interconnect layers over the silicon nitride optical component, each of the multiple interconnect layers including a metal interconnect therein; a first optical deflector over the multiple interconnect layers that deflects light within a first portion of an ambient light range of 380 to 570 nanometers (nm); and at least one second optical deflector over the first optical deflector, each second optical deflector deflecting light within a different portion of the ambient light range between 380 to 570 nm than the first optical deflector and any other second optical deflector.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a photonic integrated circuit (PIC) die that includes one or more optical deflectors to prevent light-induced damage (LID) to silicon nitride (SiN) optical components in the PIC die. The PIC die includes an active region over a substrate, and a SiN optical component. The SiN optical component can be over the active region. The PIC die also includes multiple interconnect layers over the active region and the SiN optical component, e.g., back-end-of-line or middle-of-line connections. Each of the multiple interconnect layers may include a metal interconnect therein, e.g., a metal wire or via. The PIC die also includes at least one optical deflector over the multiple interconnect layers and over the SiN optical component. A contact may optionally extend through the at least one deflector to an uppermost interconnect layer of a plurality of interconnect layers, including the multiple interconnect layers. The optical deflector(s) do not include electrical interconnects other than the contact(s) passing therethrough to the multiple interconnect layers. In certain embodiments, each optical deflector deflects light within an ambient light wavelength range of 380 to 570 nanometers (nm), i.e., each optical deflector can deflect all or portion(s) of the ambient light wavelength range. However, it has been discovered that certain wavelengths in ambient light are more damaging to SiN optic components than other wavelengths. Notably, it has been identified that light wavelengths less than 570 nm (yellow light) are more damaging to SiN optical components than other ambient light. More particularly, it has been discovered that violet light with wavelengths between 380-450 nm, blue light with wavelengths between 450-495 nm, and green light with wavelengths between 495-570 nm are more damaging to SiN optic components than other ambient light. To address this situation, in certain embodiments, different optical deflectors may deflect different portions of the ambient light wavelength range. More particularly, in certain embodiments, a first optical deflector may deflect light within a first portion of ambient light having wavelengths between 380-450 nm (i.e., violet light), and a second optical deflector may deflect light within a second portion of ambient light having wavelengths between 450-495 nm (i.e., blue light) or 495-570 nm (i.e., green light). Other optical deflectors may also be provided to deflect other wavelengths of ambient light. For example, in certain embodiments, a first optical deflector may deflect light within a first portion of ambient light having wavelengths between 380-450 nm (i.e., violet light), a second optical deflector may deflect light within a second portion of ambient light having wavelengths between 450-495 nm (i.e., blue light), and a third optical deflector may deflect light within a third portion of ambient light having wavelengths between 495-570 nm (i.e., green light). The optical deflector(s) can also be configured to allow other, desirable wavelengths through.

The optical deflector(s) provide full coverage to the SiN optic components and protects them from ambient light illumination, which mitigates and/or solves the LID issue. The optical deflector(s) are also compatible and consistent with monolithic silicon photonics (SiPh) platforms and process flows, and thus are easy to implement. The optical deflector(s) on top of the multiple interconnect layers, e.g., BEOL, do not interfere with the various light modes of the SiN optic components, e.g., transverse electric (TE), transverse magnetic (TM), or other modes.

Figure 1:
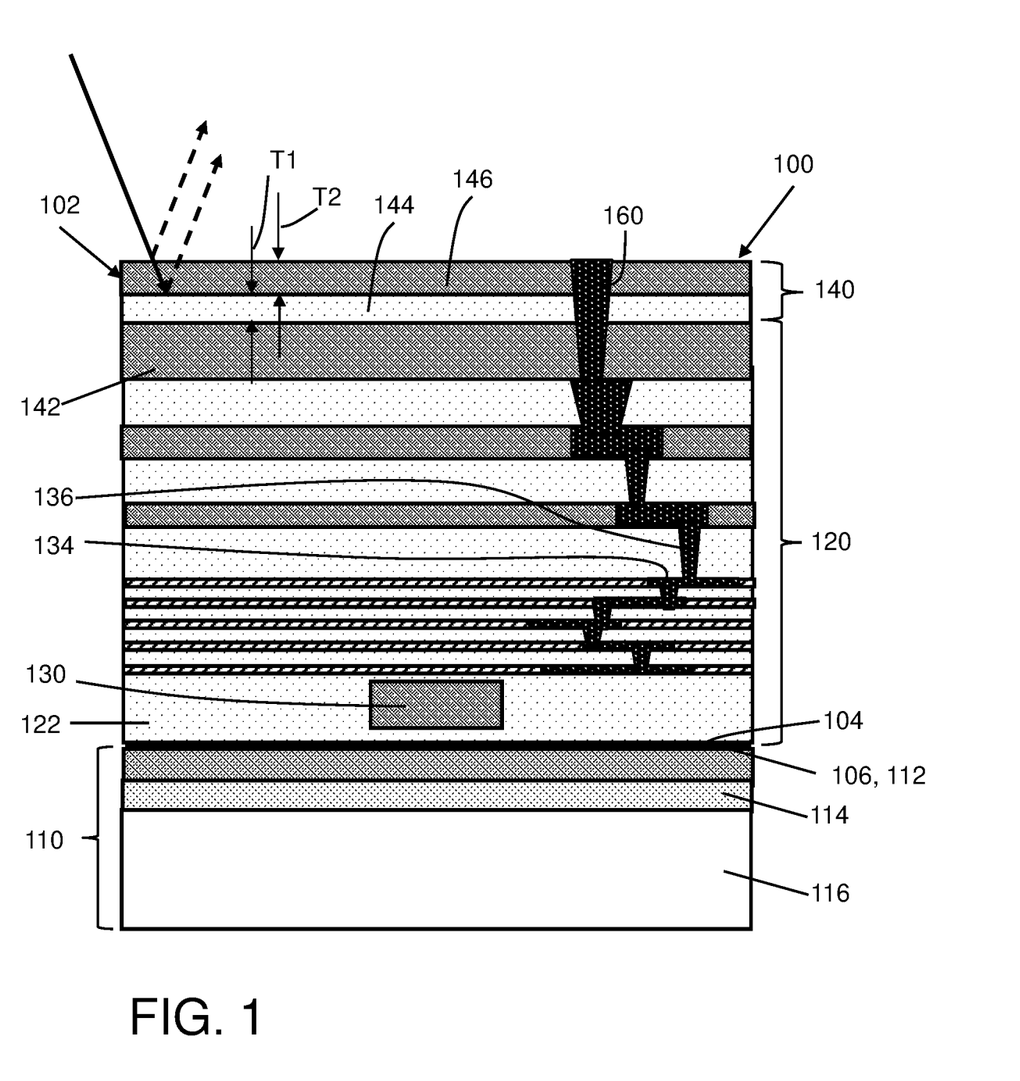
FIG. 1 shows a cross-sectional view of a photonic integrated circuit (PIC) die including a two-layer optical deflector over multiple interconnect layers, according to embodiments of the disclosure.

FIG. 1 shows a cross-sectional view of PIC die 100 according to embodiments of the disclosure. PIC structure 100 can provide any now known or later developed photonics integrated circuit functions and any necessary active components to provide such functions. PIC structure 100 includes a body 102 including an active region 104 over a substrate 116. Active region 104 may include, among other integrated circuit components, a plurality of transistors therein (indicated by thicker line in active region 104). Active region 104 may take any now known or later developed form. In one non-limiting example, active region 104 may include several transistors (thick line) formed in and/or on an active layer 106. However, any component typically found in an active region of a PIC structure may be employed. In one non-limiting example shown, active region 106 may be formed over a semiconductor-on-insulator (SOI) substrate 110. SOI substrate 110 may include an active (SOI) layer 112 including a semiconductor such as silicon, silicon germanium or other semiconductor materials. As known in the art, active SOI layer 112 may be doped in certain regions to form parts of transistors, interconnects, or other components. In the non-limiting example shown, active layer 112 is over a buried insulator layer 114, which is over a base substrate 116. Buried insulator layer 114 may include, for example, silicon dioxide, and base substrate 116 may include a semiconductor, e.g., silicon. While active region 104 is shown using an SOI substrate 110, it will be recognized that the teachings of the disclosure are applicable to any form of IC substrate, e.g., a bulk substrate.

PIC structure 100 also includes multiple interconnect layers 120 over active region 106. Interconnect layers 120 may include any now known or later developed interlayer dielectric material, such as but not limited to: silicon dioxide materials, fluorinated silicate glass (FSG), organic polymeric thermoset materials, silicon oxycarbide, hydrogenated silicon oxycarbide (SiCOH) dielectrics, fluorine doped silicon oxide, spin-on glasses, silsesquioxanes, etc. Interconnect layers 120 may also include any now known or later developed electrical interconnects 134, 136 (only some shown for clarity) within the layers, such as horizontal metal wiring 134 and vertical vias 136 to electrically interconnect, for example, parts of active region 104. The metal wiring and vias may include bodies of any now known or later developed conductive materials such a copper, aluminum, tungsten, etc., and may include refractory metal liners of, for example, tantalum (Ta), titanium (Ti), tungsten (W), iridium (Ir), rhodium (Rh) and platinum (Pt), etc., or mixtures thereof. The electrical interconnects may be formed using any thin film technology. Interconnect layers 120 become progressively thicker from top to bottom in PIC die 100. Consequently, adjacent interconnect layers 120 have different thicknesses.

Active region 104 and interconnect layers 120 may be formed using any now known or later developed thin film technology. Interconnect layers 120 may include any back-end-of-line (BEOL) or middle-of-line (MOL) interconnect layers, i.e., interconnect layers formed during device manufacturing following first metallization. Any number of interconnect layers 120 may be provided.

PIC die 100 also includes a silicon nitride (SiN) optical component 130 over active region 104. SiN optical component 130 can include any now known or later developed SiN containing device for use in a PIC die 100 such as but not limited to a waveguide, an optical splitter, etc. SiN optical component 130 may include any form of silicon nitride. As explained, the silicon nitride is prone to damage from ambient light exposure. The type of damage can include any changes that curtail the material's ability to act as an optical component. For example, where SiN optical component 130 includes a waveguide, the damage may change or limit its ability to propagate light. SiN optical component 130 may be in any layer over active region 104, including one or more interconnect layers 120, e.g., a layer 122. In any event, any number of interconnect layers 120 are also over active region 104 and perhaps over SiN optical component 130. In certain embodiments, for example, SiN optical component 130 includes a waveguide under interconnect layer(s) 120 and over active region 104. In other embodiments, SiN optical component 130 includes a waveguide at least partially within of interconnect layer(s) 120 and over active region 104. Each interconnect layer 120 may include a metal interconnect such as a horizontal metal wire 134 or vertical via 136. It is emphasized that only a small portion of metal interconnects 134, 136 in example interconnect layers 120 are shown for illustrative purposes.

PIC die 100 also includes at least one optical deflector 140 (only one shown in FIG. 1) over interconnect layers 120 and over SiN optical component 130. Each optical deflector 140 deflects light within an ambient light range of 380 to 570 nanometers (nm).

Figure 2:
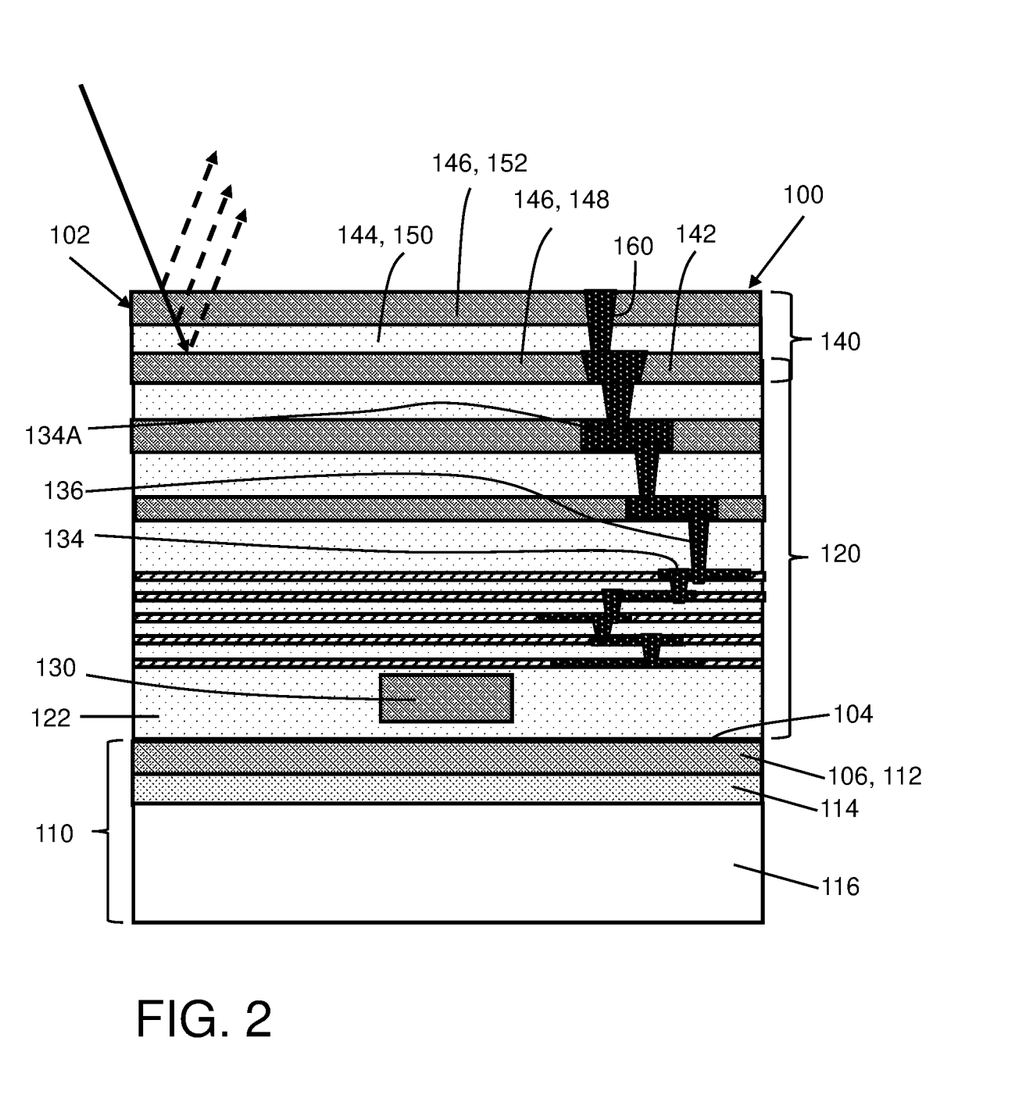
FIG. 2 shows a cross-sectional view of a PIC die including a three-layer optical deflector over interconnect layers, according to embodiments of the disclosure.
Figure 3:
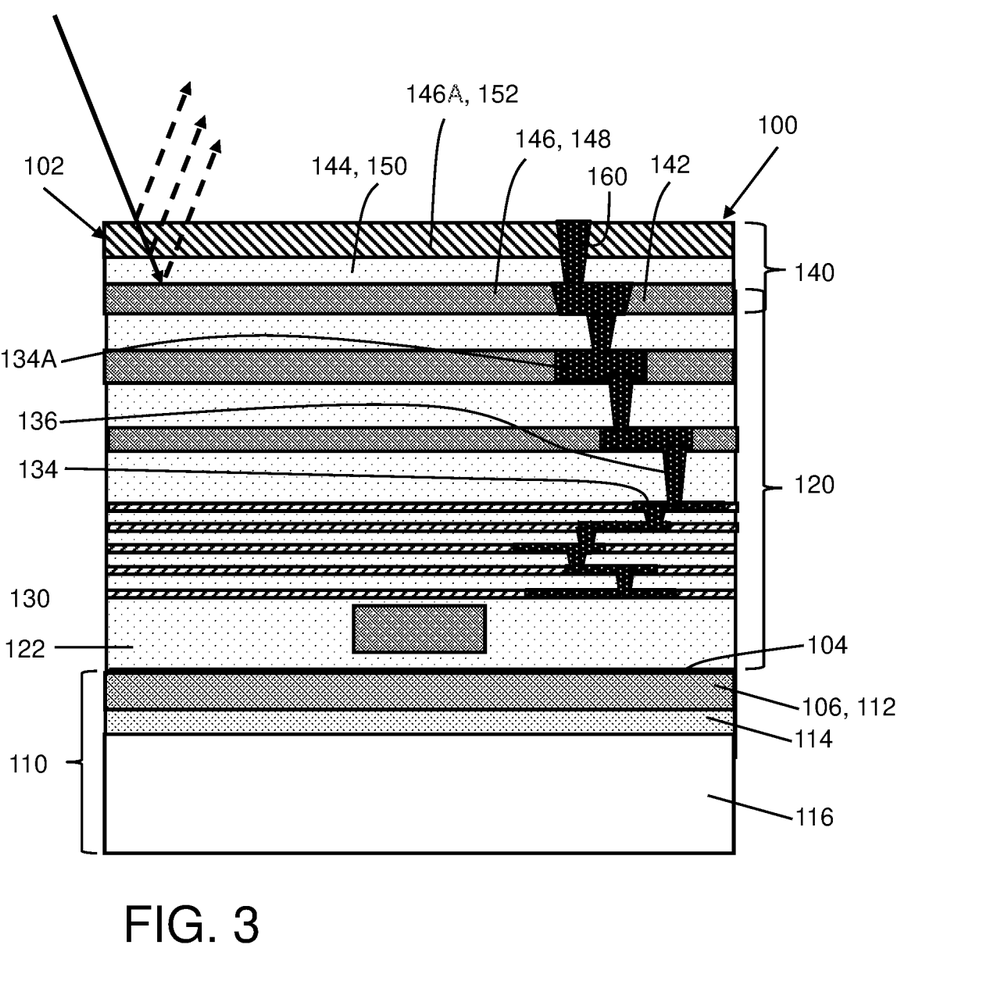
FIG. 3 shows a cross-sectional view of a PIC die including a three-layer optical deflector over interconnect layers, according to other embodiments of the disclosure.

Optical deflector(s) 140 can take a variety of forms depending on, for example, its location, number and/or the wavelength of light to be deflected thereby. As shown in FIG. 1, in certain embodiments, optical deflector(s) 140 may include several dielectric layers positioned over the normally present interconnect layers 120 of PIC die 100. In this case, PIC die 100 can electrically and/or optically function without optical deflector(s) 140. In other embodiments, shown for example in FIGS. 2-3, optical deflector(s) 140 may include an uppermost interconnect layer 142 of a plurality of interconnect layers including multiple interconnect layers 120, i.e., it may enable electrical and/or optical functioning of PIC die 100 apart from optical deflector(s) 140. (FIGS. 2 and 3 show the latter situation by way of the overlapping brackets for optical deflector 140 and multiple interconnect layers 120 and show uppermost interconnect layer 142 including a metal wire 134.) In any event, each optical deflector 140 includes a plurality of alternating dielectric layers including at least one high refractive index dielectric layer 144, e.g., higher than 1.75, and at least one low refractive index dielectric layer 146, e.g., lower than 1.75. (In the drawings, particular arrangements of different refractive index dielectric layers 144, 146 may be shown with one or the other layer being lowermost in the stack. It is emphasized that which refractive index dielectric layer is lowermost on the stack may be switched without departing from the scope of the disclosure.) Each of the plurality of alternating layers in optical deflector(s) 140 have a different thickness, i.e., each layer has a different thickness T1, T2, etc. (see FIG. 1), which is selected depending on the wavelength range to be deflected. In one non-limiting example, an optical deflector 140 may have an overall thickness of approximately 250 nanometers, but the thickness can vary.

Referring to FIGS. 1-3, each optical deflector 140 may include at least two alternating dielectric layers of high refractive index dielectric layer(s) 144 and low refractive index dielectric layer(s) 146. Referring to the cross-sectional view of FIG. 1, in certain embodiments, each optical deflector 140 may include a high refractive index dielectric layer 144 and a low refractive index dielectric layer 146. Referring to the cross-sectional views of FIGS. 2-3, in other embodiments, each optical deflector 140 may include at least three alternating dielectric layers of high refractive index dielectric layer(s) 144 and low refractive index dielectric layer(s) 146, i.e., two of one type layer and one of the other type of layer. The dielectric layers may include different materials chosen for their refractive index but are all compatible with silicon photonics platforms and processes, i.e., they can be readily added to PIC die 100 over interconnect layers 120. Some of the optical deflector dielectric layers may be those typically used for interconnect layers 120, but this is not required so long as they are compatible with silicon photonics platforms and processes compatible with silicon photonics platforms and processes. A non-comprehensive list of dielectric materials for optical detector(s) 140 may include: silicon nitride (refractive index ~2.0), tetraethyl orthosilicate (TEOS) (refractive index ~1.5), silicon oxide ($SiO_2$) (refractive index ~1.5), silicon-oxy-carbo-hydrogen (Si—O—C—H) (refractive index ~1.4), silicon-carbo-nitride-hydrogen (Si—C—N—H) (refractive index ~2), titanium oxide ($TiO_2$) (refractive index ~2.5) and tantalum oxide ($Ta_2O_5$) (refractive index ~2.1), with all refractive indices measured at 633 nanometers.

In one embodiment, shown in FIG. 1, a single optical deflector 140 may include first dielectric layer 144 and second dielectric layer 146 that are different and have different refractive indices. The materials may be chosen from the list above. In one example, first dielectric layer 144 may include silicon oxide and second dielectric layer 146 may include silicon nitride. Each of layers 144, 146 may have the same thicknesses or they may have different thicknesses, and usually (but not necessarily) have different thicknesses to interconnect layers 120.

Figure 4:
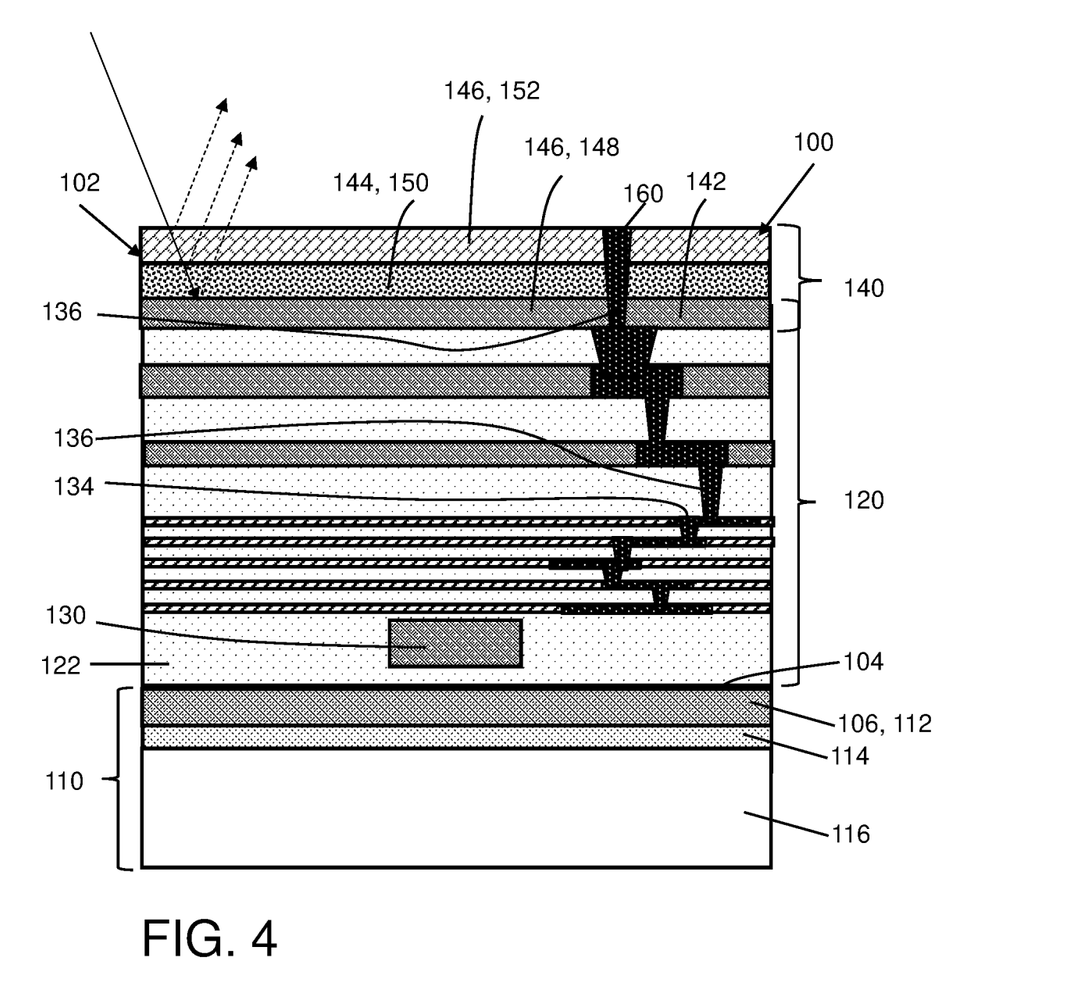
FIG. 4 shows a cross-sectional view of a PIC die including a three-layer optical deflector over interconnect layers, according to additional embodiments of the disclosure.

In other embodiments, shown for example in FIGS. 2 and 3, optical deflector(s) 140 may include a first dielectric layer 148 having a first refractive index, a second dielectric layer 150 having a second refractive index over first dielectric layer 148, and a third dielectric layer 152 over second dielectric layer 150 and having a third refractive index different than the first refractive index and the second refractive index. In this case, first dielectric layer 148 may include a first silicon nitride layer, and may be uppermost interconnect layer 142 and may include at least one of a contact 136 and a wire 134A (shown) therein. Each of first dielectric layer 148 and second and third dielectric layers 150, 152 can have different thicknesses, which is also different than interconnect layers 120. In one example, as shown in FIG. 2, second dielectric layer 150 may include a silicon oxide layer, and third dielectric layer 152 may include another, perhaps different second silicon nitride layer. In another embodiment, shown in FIG. 3, first dielectric layer 148 may include first silicon nitride layer, second dielectric layer 150 may include a silicon oxide layer, and third dielectric layer 152 may include a Si—C—N—H layer. In another embodiment, shown in the cross-sectional view of FIG. 4, first dielectric layer 148 may include first silicon nitride layer, second dielectric layer 150 may include an oxide layer (e.g., silicon oxide ($SiO_2$)), and third dielectric layer 152 may include a $TiO_2$ layer. Other dielectric materials are also possible in a three-layer optical detector 140. A non-comprehensive list may include: SiN over Si—C—N—H over SiN; Si—C—N—H over silicon oxide over Si—C—N—H; $TiO_2$ over silicon oxide over SiN; or $Ta_2O_5$ over silicon oxide over Si—C—N—H.

As shown in the drawings, PIC die 100 may also optionally include at least one contact (via) 160 extending through optical deflector(s) 140 to uppermost interconnect layer 142 of a plurality of interconnect layers including multiple interconnect layers 120, e.g., to an electrical interconnect in uppermost interconnect layer 142 such as wire 134A (shown) or via 136, in uppermost interconnect layer 142. Contact(s) 160 may be formed as part of last via etch to pads within uppermost interconnect layer 142. Optical deflector(s) 140 do not include any electrical interconnects other than contact(s) 160 passing therethrough to multiple interconnect layers 120, i.e., uppermost interconnect layer 142.

Figure 5:
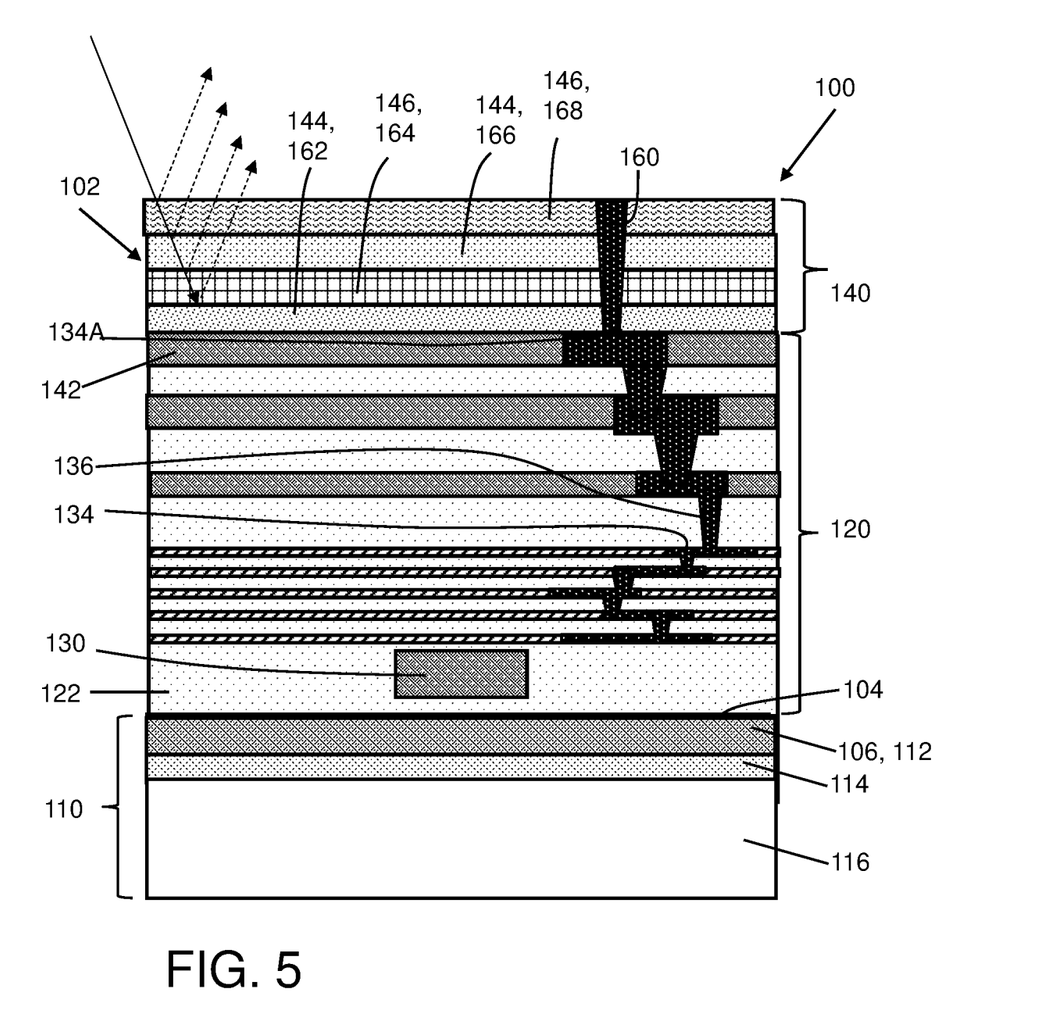
FIG. 5 shows a cross-sectional view of a PIC die including a four-layer optical deflector over interconnect layers, according to embodiments of the disclosure.

FIG. 5 shows a cross-sectional view of PIC die 100 including an optical detector 140 including four dielectric layers 162, 164, 166, 168 with different refractive indices. Optical detector(s) 140 can also include more than four dielectric layers.

Figure 6:
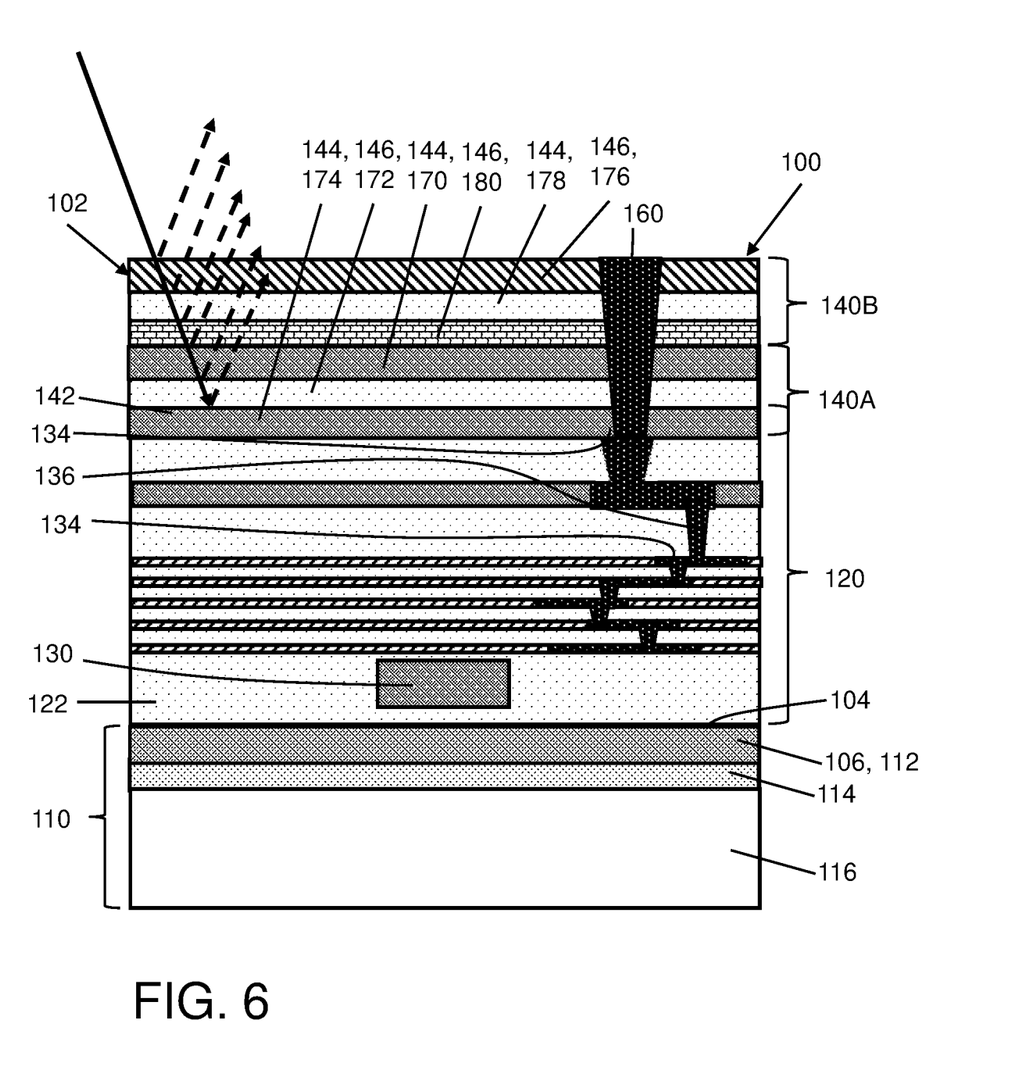
FIG. 6 shows a cross-sectional view of a PIC die including a two, three-layer optical deflectors over interconnect layers, according to embodiments of the disclosure.

FIG. 6 shows a cross-sectional view of an embodiment of PIC die 100 in which two optical deflectors 140A, 140B are used. In the FIG. 6 example, each optical deflector 140A, 140B includes three layers of different refractive index dielectric layers 144, 146. While a wide variety of variations can be employed, in one non-limiting example, a first optical deflector 140A may include a silicon nitride layer 170 over a silicon oxide layer 172 over a silicon nitride layer 174, and a second optical deflector 140B may include a Si—C—N—H layer 176 over a silicon oxide layer 177 over a Si—C—N—H layer 180. Each optical deflector 140A, 140B deflects light within a different portion of an ambient light range of 380 to 570 nm. More particularly, each optical deflector 140A, 140B deflects light within a different portion of the ambient light range of less than 570 nm. In certain embodiments, first optical deflector 140A may deflect light within a first portion of ambient light having wavelengths between 380-450 nanometers, and second optical deflector 140B may deflect light within a second portion of ambient light having wavelengths between 450-495 nm or 495-570 nm. In this manner, only the ambient light considered harmful to SiN optical component 130 is deflected. Other desirable or non-damaging wavelengths may pass through optical deflectors 140A-B.

Figure 7:
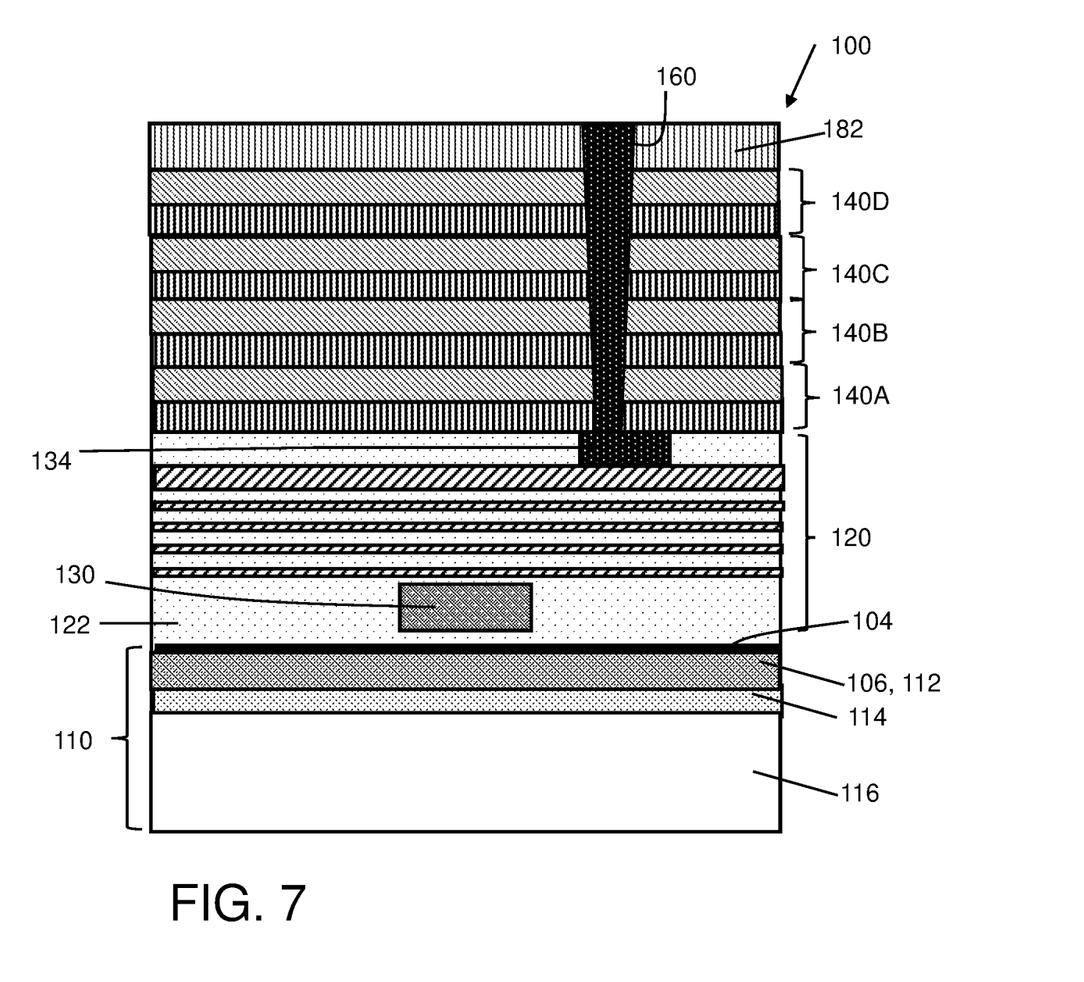
FIG. 7 shows a cross-sectional view of a PIC die including a four, two-layer optical deflectors over interconnect layers, according to embodiments of the disclosure.
Figure 8:
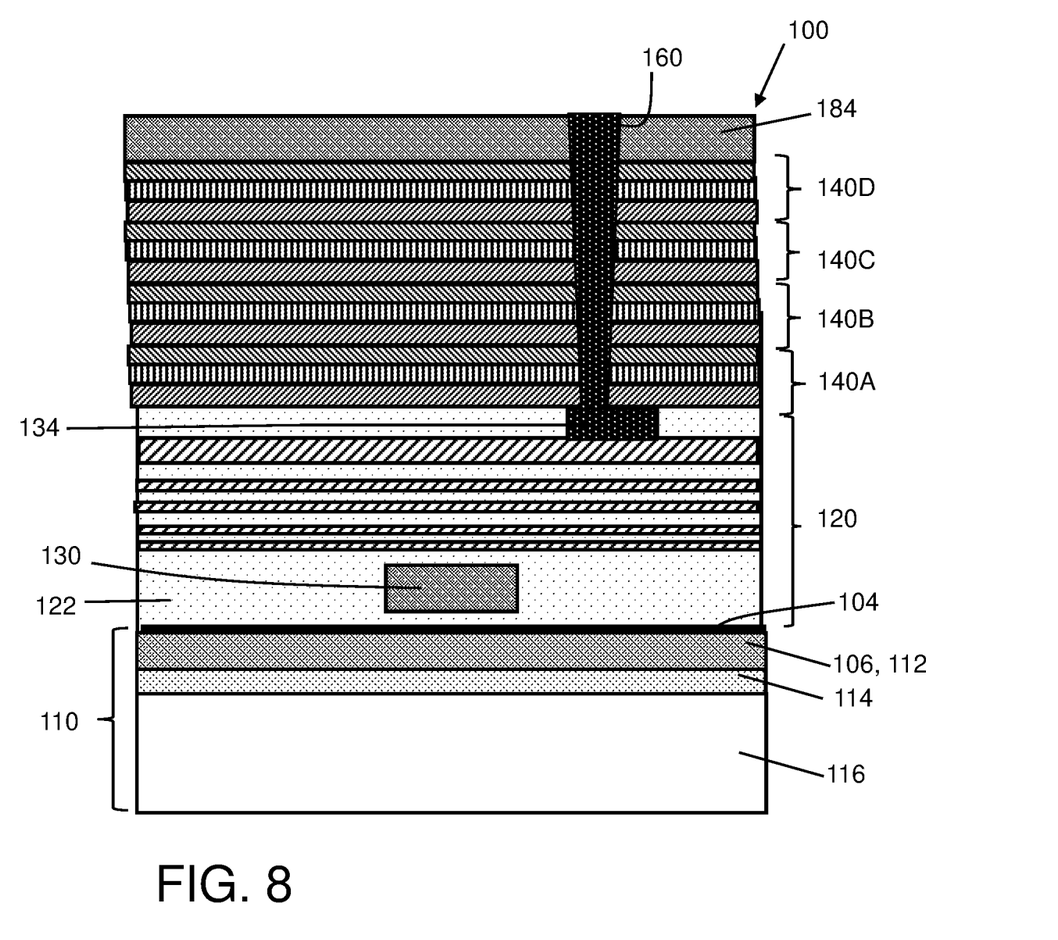
FIG. 8 shows a cross-sectional view of a PIC die including a four, three-layer optical deflectors over interconnect layers, according to other embodiments of the disclosure.

FIGS. 7 and 8 show cross-sectional views of PIC die 100 including several optical deflectors 140A-D (some interconnects in interconnect layers 120 removed for clarity). FIG. 7 shows optical deflectors 140A-D, each including two layers of different refractive index layers, and FIG. 8 shows optical deflectors 140A-D, each including three layers of different refractive index layers. FIG. 7 also shows an optional glass uppermost layer 182, e.g., of boro-phospho-silicate glass (BPSG), which can be applied to any embodiment herein. FIG. 8 also shows an optional uppermost silicon nitride cap layer 184, which can be applied to any embodiment herein.

In operation, as shown by the arrows in the upper left of most of the drawings, optical deflector(s) 140 deflects desired wavelengths of light with different layers deflecting different wavelengths in a manner that causes the deflector(s) to act as a Bragg deflector or a quarter wave plate deflector. Each layer 144, 146 deflects some light and allows some light to pass through which is reflected at the interface with the next layer. The material and thicknesses T (FIG. 1) of layers 144, 146 of optical deflector(s) 140 can be configured to cumulatively deflect most (e.g., 99%) of the harmful wavelengths of ambient light. The optical deflector(s) 140 have layers having a different thickness, which are different than the thicknesses of an adjacent interconnect layer 120. Optical deflector(s) 140 may be formed using any appropriate technique compatible with silicon photonic platforms and processes, such as but not limited to chemical vapor deposition. Each layer 144, 146 may range in thickness from 10 nanometers (nm)-500 nm.

The optical deflector(s) provide full coverage to the SiN optic components and protect(s) them from ambient light illumination, which mitigates and/or solves the LID issue. The optical deflector(s) are also compatible and consistent with monolithic silicon photonics (SiPh) platforms and process flows, and thus are easy to implement. The optical deflector(s) on top of multiple interconnect layers, e.g., BEOL, do not interfere with the various light modes of the SiN optic components, e.g., transverse electric (TE), transverse magnetic (TM), or other modes. Any number of optical deflectors may be provided to deflect the desired wavelengths of ambient light.

The method and structures described above are used in the fabrication of photonic integrated circuit dies or chips. The resulting PIC dies can be distributed by the fabricator in raw wafer form (that is, as a single wafer that has multiple unpackaged chips), as a bare die, or in a packaged form. In the latter case the PIC die is mounted in a single chip package (such as a plastic carrier, with leads that are affixed to a motherboard or other higher level carrier) or in a multichip package (such as a ceramic carrier that has either or both surface interconnections or buried interconnections). In any case the PIC die may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor, to modules for communication, sensing, LiDAR, and other applications.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A photonic integrated circuit (PIC) die, comprising:
   an active region over a substrate;
   a silicon nitride optical component;
   multiple interconnect layers over the active region, each of the multiple interconnect layers including a metal interconnect therein; and
   at least one optical deflector over the multiple interconnect layers and over the silicon nitride optical component.

2. The PIC die of claim 1, wherein each optical deflector includes a plurality of alternating dielectric layers including at least one high refractive index dielectric layer and at least one low refractive index dielectric layer.

3. The PIC die of claim 2, wherein each optical deflector includes at least three alternating dielectric layers of the at least one high refractive index dielectric layer and the at least one low refractive index dielectric layer.

4. The PIC die of claim 2, wherein the high refractive index dielectric layer and the low refractive index dielectric layer are chosen from a group consisting of: silicon nitride, tetraethyl orthosilicate (TEOS), silicon oxide ($SiO_2$), silicon nitride, silicon-oxy-carbo-hydrogen (Si—O—C—H), silicon-carbo-nitride-hydrogen (Si—C—N—H), titanium oxide ($TiO_2$) and tantalum oxide ($Ta_2O_5$).

5. The PIC die of claim 1, wherein the at least one optical deflector includes a first dielectric layer having a first refractive index, a second dielectric layer having a second refractive index over the first dielectric layer, and a third dielectric layer over the first dielectric layer and the second dielectric layer having a third refractive index different than the first refractive index and the second refractive index.

6. The PIC die of claim 5, wherein the first dielectric layer includes a first silicon nitride layer, the second dielectric layer includes a silicon oxide layer, and the third dielectric layer includes a second silicon nitride layer.

7. The PIC die of claim 5, wherein the first dielectric layer includes a silicon nitride layer, the second dielectric layer includes a silicon oxide layer, and the third dielectric layer includes a silicon-carbo-nitride-hydrogen (Si—C—N—H) layer.

8. The PIC die of claim 5, wherein the first dielectric layer is an uppermost layer of a plurality of interconnect layers, which includes the multiple interconnect layers, and the first dielectric layer includes at least one of a contact and a wire therein.

9. The PIC die of claim 1, wherein the at least one optical deflector deflects ambient light within a wavelength range of 380 nm to 570 nm.

10. The PIC die of claim 1, wherein the at least one optical deflector includes at least two optical deflectors, each optical deflector deflecting ambient light within a different portion of wavelengths of less than 570 nm.

11. The PIC die of claim 10, wherein a first optical deflector of the at least two optical deflectors includes a first silicon nitride layer over a first silicon oxide layer over a second silicon nitride layer, and a second optical deflector of the at least two optical deflectors includes a first silicon-carbo-nitride-hydrogen (Si—C—N—H) layer over a second silicon oxide layer over a second Si—C—N—H layer.

12. The PIC die of claim 11, wherein the first optical deflector deflects light within a first portion of ambient light having wavelengths between 380-450 nanometers (nm), and the second optical deflector deflects light within a second portion of ambient light having wavelengths between 450-495 nm or between 495-570 nm.

13. A photonic integrated circuit (PIC) die, comprising:
   an active region over a substrate;
   a silicon nitride waveguide;
   multiple interconnect layers over the active region, each of the multiple interconnect layers including a metal interconnect therein; and
   at least one optical deflector over the multiple interconnect layers, each optical deflector including a plurality of alternating layers including at least one high refractive index dielectric layer and at least one low refractive index dielectric layer.

14. The PIC die of claim 13, wherein each optical deflector includes at least three alternating dielectric layers of the at least one high refractive index dielectric layer and the at least one low refractive index dielectric layer.

15. The PIC die of claim 13, wherein the plurality of alternating layers of the at least one optical deflector includes a first dielectric layer having a first refractive index, and a second dielectric layer having a second refractive index different than the first refractive index over the first dielectric layer.

16. The PIC die of claim 15, wherein the first dielectric layer and the second dielectric layer are different and have different refractive indices, and are chosen from a group consisting of: silicon nitride, tetraethyl orthosilicate (TEOS), silicon oxide ($SiO_2$), silicon nitride, silicon-oxy-carbo-hydrogen (Si—O—C—H), silicon-carbo-nitride-hydrogen (Si—C—N—H), titanium oxide ($TiO_2$) and tantalum oxide ($Ta_2O_5$).

17. The PIC die of claim 13, wherein the at least one optical deflector includes at least two optical deflectors, each optical deflector deflecting ambient light within a different portion of wavelengths of less than 570 nm.

18. The PIC die of claim 17, wherein the at least one optical deflector includes a first optical deflector that deflects light within a first portion of ambient light having wavelengths between 380-450 nanometers, and a second optical deflector that deflects light within a second portion of ambient light having wavelengths between 450-495 nm or between 495-570 nm.

19. A photonic integrated circuit (PIC) die, comprising:
an active region over a substrate;
a silicon nitride optical component;
multiple interconnect layers over the silicon nitride optical component, each of the multiple interconnect layers including a metal interconnect therein;
a first optical deflector over the multiple interconnect layers that deflects light within a first portion of an ambient light range of 380 to 570 nanometers (nm); and
at least one second optical deflector over the first optical deflector, each second optical deflector deflecting light within a different portion of the ambient light range between 380 to 570 nm than the first optical deflector and any other second optical deflector.

20. The PIC die of claim 19, wherein the first portion of ambient light has wavelengths between 380-450 nm, and the second portion of ambient light has wavelengths between 450-495 nm or between 495-570 nm.

\* \* \* \* \*